(12) United States Patent
Campbell et al.

(10) Patent No.: US 6,202,031 B1
(45) Date of Patent: Mar. 13, 2001

(54) METHOD OF CALIBRATING AN AUTOMATED PLACEMENT MACHINE

(75) Inventors: Scott Campbell, Summerville, OR (US); Robert Huelsenbeck, Nampa, ID (US)

(73) Assignee: MCMS, Inc., Nampa, ID (US)

( * ) Notice: Subject to any disclaimer, the term of this patent is extended or adjusted under 35 U.S.C. 154(b) by 0 days.

(21) Appl. No.: 09/057,278

(22) Filed: Apr. 8, 1998

(51) Int. Cl.[7] .................................................. G05B 19/04
(52) U.S. Cl. ............................ 702/95; 700/254; 702/152
(58) Field of Search ...................... 702/95, 152; 73/1.79; 33/502; 700/57, 121, 254

(56) References Cited

U.S. PATENT DOCUMENTS

| | | | | |
|---|---|---|---|---|
| 4,980,971 | * | 1/1991 | Bartschat et al. | 29/833 |
| 5,392,384 | * | 2/1995 | Tounai et al. | 395/89 |
| 5,400,638 | * | 3/1995 | Kim | 73/1 J |
| 5,418,890 | * | 5/1995 | Ishihara et al. | 395/89 |
| 5,433,013 | * | 7/1995 | Woodhouse | 33/533 |
| 5,471,312 | * | 11/1995 | Watanbe et al. | 358/296 |
| 5,528,116 | * | 6/1996 | Snell | 318/568.13 |
| 5,539,992 | * | 7/1996 | Woodhouse | 33/533 |
| 5,687,293 | * | 11/1997 | Snell | 395/89 |
| 5,690,744 | * | 11/1997 | Landau | 118/715 |
| 5,783,834 | * | 7/1998 | Shatas | 250/559.33 |
| 5,971,997 | * | 10/1999 | Guthrie et al. | 606/130 |
| 6,018,865 | * | 2/2000 | Michael | 29/740 |
| 6,044,308 | * | 3/2000 | Huissoon | 700/166 |
| 6,050,151 | * | 4/2000 | Larson | 73/865.9 |

* cited by examiner

*Primary Examiner*—Patrick Assouad
(74) *Attorney, Agent, or Firm*—Knobbe, Martens, Olsen & Bear

(57) ABSTRACT

A method of calibrating an automated placement machine having a robotic arm for picking up parts from a parts tray and a drawer for holding the parts tray therein. The method includes the acts of: positioning a calibration jig so that it is juxtapositioned at a corner of the drawer of the placement machine; positioning the robotic arm of the placement machine such that a portion of the robotic arm engages a portion of the calibration jig; determining a first set of spatial coordinates of the robotic arm when it is engaged with the calibration jig; and setting an origin point for the robotic arm such that the first set of spatial coordinates serves as the origin point from which movements of the robotic arm may be gauged.

10 Claims, 7 Drawing Sheets

METHOD OF CALIBRATING AN AUTOMATED PLACEMENT MACHINE

RELATED APPLICATIONS

This application is related to a commonly-owned, co-pending U.S. patent application entitled, CALIBRATION JIG FOR AN AUTOMATED PLACEMENT MACHINE, U.S. application Ser. No. 09/057,033, Attorney Docket No. MCMSPAT.011A, filed concurrently herewith.

BACKGROUND OF THE INVENTION

1. Field of the Invention

The invention relates to the automatic placement of components onto circuit boards. More particularly, the invention relates to a method and apparatus for calibrating an automated placement machine which retrieves parts from a parts tray and places them onto desired locations of an assembly such as a printed circuit board (PCB).

2. Description of the Related Art

In the electronics industry, high speed automated placement machines are often used to place electronic parts or components onto bare PCBs. These automated placement machines typically include a robotic arm which has a vacuum nozzle for lifting an electronic component, carrying the component to a designated location, and placing the component onto a PCB at a designated location on the PCB. With the use of some automated placement machines, after the part is picked up by the robotic arm, the part is placed onto a part shuttle which transports the part within the vicinity of a second robotic arm of the automated placement machine. The second robotic arm also includes a vacuum nozzle that picks up the part from the parts shuttle and places the part at a designated location on the PCB. In order to expedite this process, components are typically extracted directly out of the packaging medium in which they are shipped by a manufacturer, or distributor, of the components.

One commonly used packaging medium is known as a parts tray. Typically, parts trays contain a number of cavities, each capable of containing a component therein. The physical dimensions of each cavity within a particular parts tray are typically the same for each cavity and the cavities are usually arranged in a uniform matrix pattern. Therefore, by knowing the dimensions of each cavity and also taking into account the particular matrix configuration of the cavities for a particular parts tray, it is possible to calculate the relative spatial coordinates (i.e., positions) of each of the components contained within these cavities with respect to a common point of reference. After the coordinate positions of each of the components have been determined, the robotic arm may be programmed to successively move to each coordinate position corresponding to the location of the components in order to retrieve each of the components from it's respective cavity.

In one prior art method, multiple parts trays may be accessed by an automated placement machine by providing a multi-tray unit, as it is commonly known in the industry. The multi-tray unit includes multiple drawers, each capable of holding one or more parts trays therein. The multiple drawers are typically stacked one on top of another. When a robotic arm is programmed to access a parts tray in one of the drawers, the multi-tray unit will move select drawers in the stack so as to create a space above the designated drawer containing the desired parts tray. The robotic arm can then move in this space above the designated drawer in order to retrieve components from the designated parts tray.

Referring to FIG. 1, a typical multi-tray unit 100 is illustrated. The multi-tray unit 100 includes a base 101 and a tray tower 103 attached to and extending upwardly from the base 101.

Multiple drawers 105 are coupled to the tray tower 103. Each drawer 105 is typically movably attached to the tray tower 103 by means of a lead screw assembly 107, driven by a lead screw assembly motor 108, which can move a select group of the drawers 105. Each drawer 105 includes a cavity 106 for receiving and holding a parts tray (not shown) therein. The multi-tray unit 100 of FIG. 1, as well as various other types of multi-tray units, which perform similar functions to those described above, are well-known in the art. In one embodiment, the multi-tray unit 100 is a Fuji Multi-tray unit manufactured by Fuji, Inc. which is available with the Fuji-IP2 or IP3 automated placement machines.

When an automated placement machine (not shown) is programmed to retrieve a particular component from a designated parts tray, a robotic arm 109 of the automated placement machine will move to a particular spatial coordinate which has been programmed into a database of the automated placement machine. As shown in FIG. 1, the robotic arm 109 has a vacuum nozzle 111 attached thereto for picking up components from a parts tray. A designated parts tray is made accessible to the vacuum nozzle 111 of the robotic arm 109 by the tray tower 103 which moves selected drawers 105 such that a space is provided above a designated drawer 105a containing the designated parts tray. The robotic arm 109 can then move in this space above the designated drawer 105a in order to pick up selected components with its vacuum nozzle 111.

One method of providing a space above the designated drawer 105a is to move all the drawers 105 above the designated drawer 105a upwardly and away from the designated drawer 105a. Another method of making the designated drawer 105a accessible is to move the designated drawer 105a and all the drawers 105 beneath it, downwardly and away from the drawers 105 above the designed drawer 105a. In order to move the trays in this fashion, the lead screw assembly motor 108 rotates either clockwise or counter-clockwise, depending on which way the trays are to be moved, and drives the lead screw assembly 107 housed within the tray tower 103. The lead screw assembly 107 includes a threaded shaft (not shown) which has relatively large threads in the center portion of the shaft when compared to the threads at the upper and lower portions of the shaft. The larger, more coarse, threads at the center portion of the shaft causes the trays to move more quickly through the center portion of the shaft while the smaller, finer, threads at the upper and lower portions of the shaft cause the trays to move much slower so that they do not crash into the upper or lower ends of the tower assembly 103. By moving the robotic arm 109 near the area of the center portion of the shaft, the robotic arm 109 may be positioned in the space between two trays so as to be underneath one tray and above another. In this position, the robotic arm 109 can retrieve components from the parts tray immediately below the robotic arm 109.

FIG. 2 is a side elevational view of the multi-tray unit 100 of FIG. 1. As shown in FIG. 2, the robotic arm 109 is positioned above the designated drawer 105a such that the vacuum nozzle 111 may pick up a component (not shown) contained within a parts tray (not shown) which is in turn contained within the designated drawer 105a.

FIG. 3 is a perspective view of a typical parts tray 200 having multiple cavities, or pockets 201, arranged in a 3×4 matrix. Within each cavity 201 is a component 203. The parts tray 200 is a common packaging medium in which components, particularly integrated circuits (ICs), are shipped. In order to secure each of the components 203 in their respective cavities 201, the top of the parts tray 200 is typically covered with an electrostatically safe film or cover sheet (not shown). When the components 203 are ready to be assembled onto a PCB, the cover sheet on the parts tray 200 is removed and the parts tray 200 is typically inserted into a drawer 105 of a multi-tray unit 100 (FIGS. 1 and 2). As discussed above, with reference to FIG. 1, the components 203 may then by extracted from the parts tray 200 by a robotic arm 109 (FIG. 1) of an automated placement machine.

FIG. 4 is a top plan view of the parts tray 200 of FIG. 3 contained within a drawer 105 having a cavity 106 for holding the parts tray 200 therein. The parts tray 200 includes twelve cavities 201 arranged in a 3×4 matrix, each cavity 201 containing a component 203 therein. As shown in FIG. 4, a reference point 300 is selected at a point where an inside corner of the cavity 106 is located, for example. With respect to the reference point 300, the coordinates of each of the components 203 may be calculated (as explained in further detail below) such that an automated placement machine may be programmed to move a robotic arm (not shown) to the coordinates of each component 203 in order to pick up the component 203. The coordinates of a first component 203a, for example, are calculated by measuring the distances X1 and Y1. The distance X1 represents the distance along an x-axis of a two-dimensional Cartesian coordinate system between a center point 205 of the body of the first component 203a and the reference point 300. Similarly, the distance Y1 represents the distance along a y-axis of the two-dimensional Cartesian coordinate system between the center point 205 of the body of the component 203a and the reference point 300.

After the first component 203a has been retrieved and placed at a desired location, any one of the remaining components 203 may be retrieved by the robotic arm. The distance X2 represents the component pitch, or distance between adjacent components 203, in the x-direction. The distance Y2 represents the component pitch, or distance between adjacent components 203, in the y-direction. By measuring and recording the distances X1, Y1, X2 and Y2, with respect to the reference point 300, the spatial coordinates of each component 203 in the parts tray 200 may be calculated. Once calculated, these coordinates can then be entered into a software program stored in a database of an automated placement machine, such as the Fuji IP2 or IP3 placement machine. The placement machine can then move a robotic arm to the locations which correspond to these coordinates in order to retrieve components. In one embodiment, the distances XI, Y1, X2 and Y2 are manually measured by a system operator and entered as inputs to a software program stored in a database of the automated placement machine. The software program executes the protocol for moving the robotic arm to desired locations in accordance with entered data. Alternatively, the distances X1, X2, Y1 and Y2 may be automatically measured by a machine such as the vision system of an automated placement machine, for example.

Typically, a placement machine gauges the distance moved by a robotic arm by counting "motor pulses" of a motor which drives the motion of the robotic arm. A motor tick may be a specified number of rotations of a sprocket, drive wheel, or the movement of any other mechanism which has a relatively constant magnitude of motion with respect to a specified distance traveled by the robotic arm. Therefore, if the distances X1 and Y1 have been measured to be 3 and 4 inches, respectively, an automatic placement machine may first move a robotic arm, starting from a home position corresponding to the reference point 300, in the x-direction until it counts a number of motor pulses that corresponds to 3 inches. The automatic placement machine may then move the robotic arm in the y-direction until it counts a number of motor pulses that correspond to four inches.

After the robotic arm has retrieved the first component 203a and placed the component 203a onto a designated location on a PCB, the robotic arm may then retrieve a second component, typically either 203b or 203c. For example, if the robotic arm is programmed to retrieve the component 203b next, the robotic arm will first be positioned at its home position. Starting from the home position, the robotic arm may first be moved in the x-direction until the automated placement machine counts a number of motor pulses corresponding to the distance X1+X2. The robotic arm is then moved in the y-direction until a number of motor pulses corresponding to the distance Y1 are counted. After the robotic arm has been moved in this fashion, it should be at a position directly above the component 203b such that the vacuum nozzle of the robotic arm is centered above the pick-up point 205 of the component 203b.

However, the method described above is not accurate if an origin, or home position, of the robotic arm is not accurately calibrated to match the reference point 300 of FIG. 4. In prior art methods, the process of calibrating a robotic arm is performed manually by moving the robotic arm to the designated reference point. The system operator then tries to visually align a vacuum nozzle of the robotic arm such that it is centered above the reference point 300 of FIG. 4. This process requires careful judgment, and sometimes guesswork, by the system operator. Additionally, this process is tedious and unnecessarily time consuming. Accordingly, it can be appreciated that if the calibration of the home position of the robotic arm is not accurately performed, all subsequent movements of the robotic arm will be in error by an amount proportional to the error in calibration. Often times, if the operator is in error by merely a fraction of an inch in calibrating the origin position of the robotic arm, all subsequent movements of the robotic arm will be in error, leading to subsequent problems during the retrieval and placement of the components by the robotic arm. As used herein, the terms "home position," "origin," "origin point," and "origin position" are synonymous and interchangeable, and refer to a position or location of a robotic arm from which all movements of the robotic arm may be measured or gauged. As used herein, the term "calibration" and any conjugation thereof refers to the determination and setting of the home position of the robotic arm.

If the home position of the robotic arm is inaccurately calibrated, the robotic arm will either pick up each component off-center from its intended pick-up point or not be able to pick up the component at all. If the robotic arm picks up the component off-center from its intended pick-up point, it must compensate for the deviation in order to properly place the component onto the PCB. Often, if the misalignment of a component is too great, the automated placement machine can not compensate for this deviation. In this situation, the component is either placed improperly, or not placed at all.

In the electronics manufacturing industry, components such as integrated circuit (IC) chips are relatively small and must be placed onto a specified location of a PCB within millimeters of the intended location, such that the leads of the component are properly matched with specified pads on the PCB. If each lead of an IC, for example, is not properly matched with each pad of the PCB, the PCB is defective and must be reworked. Therefore, what is needed is a uniform and accurate method of consistently establishing a home position, or origin, from which the motion of the robotic arm of an automated placement machine may be gauged. By accurately calibrating the robotic arm, an automated placement machine may be programmed to automatically retrieve components from a parts tray and place them onto a PCB with a desired degree of precision.

SUMMARY OF THE INVENTION

The invention addresses the above and other needs by providing a calibration jig for easily and accurately calibrating a robotic arm of an automated placement machine by determining a home position of the robotic arm with respect to a given location and orientation of a parts tray. After the home position of the robotic arm has been calibrated, the robotic arm may thereafter be automatically moved in accordance with calculated spatial coordinates corresponding to the location of components within the cavities of a parts tray.

In one embodiment of the invention, a method of establishing an origin point for an automatic placement machine having a robotic arm which retrieves parts from a container, includes: positioning a calibration jig at a predetermined location with respect to the container; and engaging a portion of the robotic arm with the calibration jig so as to establish the origin point for the robotic arm, wherein the origin point serves as a reference point from which subsequent movements of the robotic arm are measured.

In another embodiment, a method of establishing an origin point for an automatic placement machine having a robotic arm for retrieving parts from a container, includes: positioning a calibration jig so that it is located at a predetermined location with respect to the container; positioning the robotic arm of the placement machine such that a portion of the robotic arm engages a portion of the calibration jig; determining a first set of spatial coordinates of the robotic arm when it is engaged with the calibration jig; and setting an origin point of the placement machine such that the first set of spatial coordinates serves as the origin point from which subsequent movements of the robotic arm may be measured.

In a further embodiment of the invention, a method of calibrating a home position for a robotic arm of an automated placement machine which retrieves components from a parts tray having cavities for containing components therein, includes: positioning a calibration jig at a specified distance from a first component within a cavity of the parts tray; positioning the robotic arm of the automated placement machine such that a portion of the robotic arm engages a portion of the calibration jig; determining a first set of spatial coordinates of the robotic arm when it is engaged with the calibration jig; and setting the home position of the robotic arm such that the first set of spatial coordinates serves as the home position from which subsequent movements of the robotic arm may be measured.

In yet another embodiment, a method of automatically retrieving components from a parts tray with a robotic arm of an automated placement machine, includes: determining a first set of x-y spatial coordinates corresponding to a location of a first component contained within a first cavity of the parts tray, wherein the first set of x-y spatial coordinates is determined with respect to a reference point; entering the first set of x-y spatial coordinates into a memory within an automated placement machine; positioning a calibration jig at the reference point such that a portion of the calibration jig is substantially aligned with the reference point; positioning the robotic arm of the automated placement machine such that a portion of the robotic arm engages the portion of the calibration jig; setting a home position of the robotic arm as the position of the robotic arm when it is engaged with the calibration jig; and moving the robotic arm from its home position to a location corresponding to the first set of x-y spatial coordinates so as to retrieve the first component.

DETAILED DESCRIPTION OF THE INVENTION

The invention is described in further detail below with reference to the Figures, wherein like elements are referenced with like numerals throughout.

Figure 3:
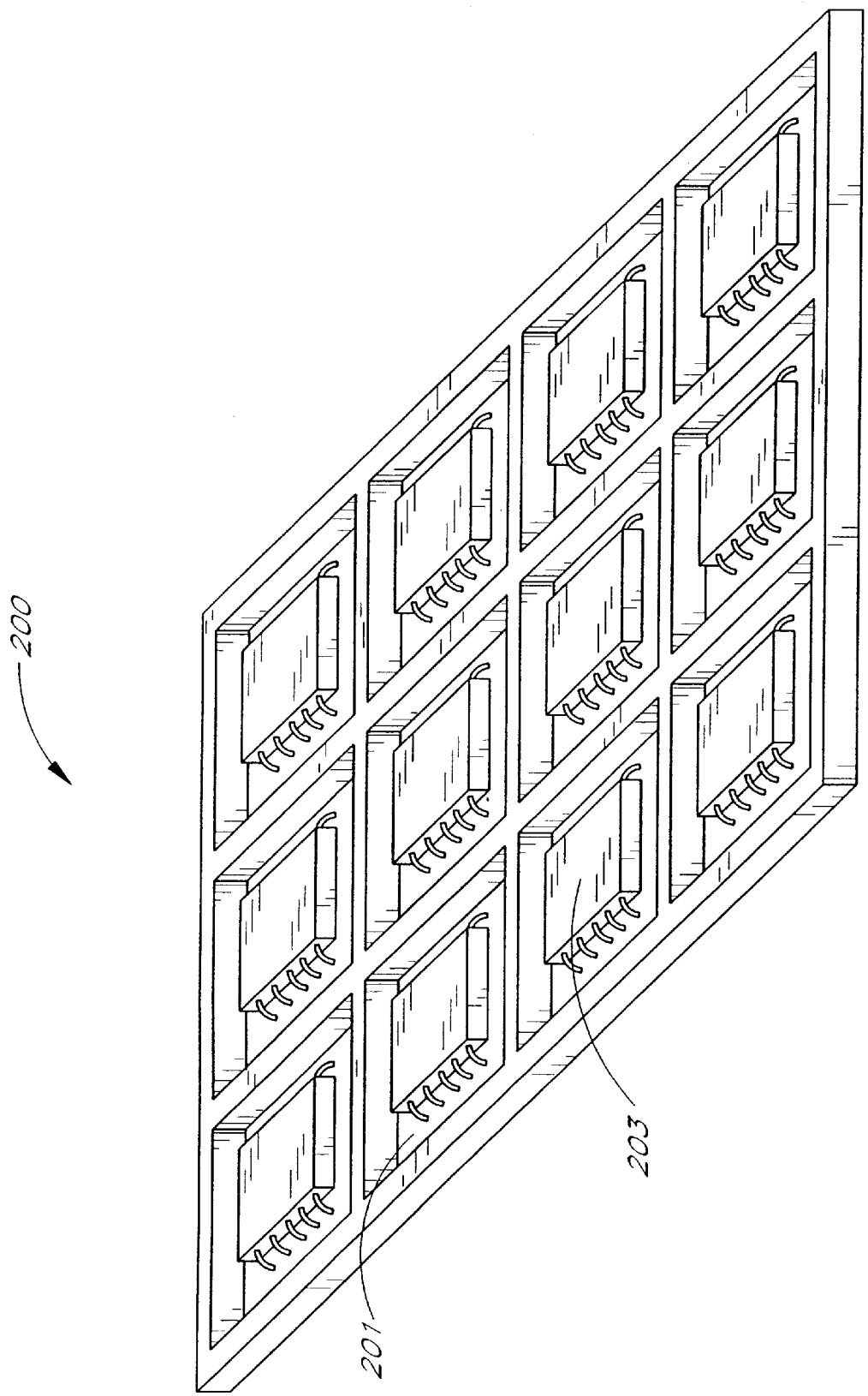
FIG. 3 is a perspective view of a typical parts tray having multiple cavities arranged in a matrix formation, each cavity holding a component therein.
Figure 5:
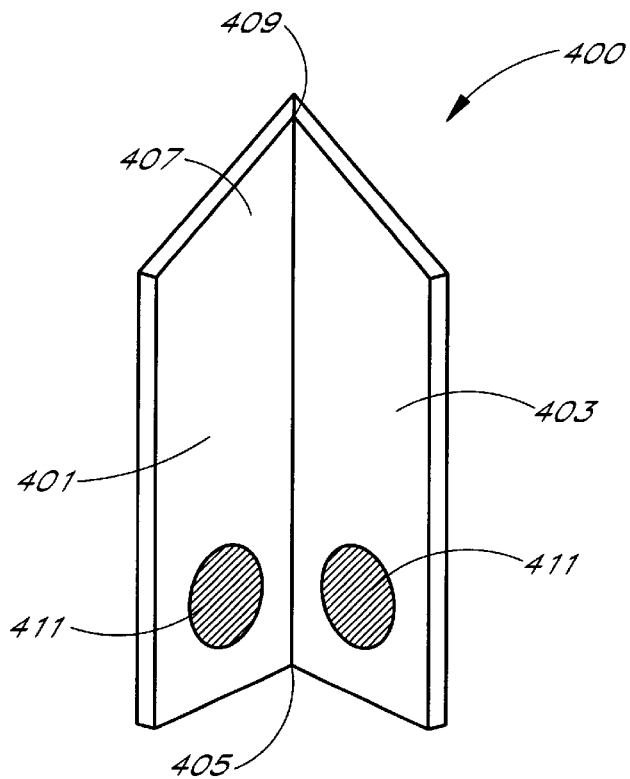
FIG. 5 is a perspective view of one embodiment of a calibration jig in accordance with the invention.

Referring to FIG. 5, a perspective view of a calibration jig 400, in accordance with one embodiment of the invention, is illustrated. The calibration jig 400 includes a first wall member 401 and a second wall member 403, which meets the first wall member 401 at a juncture, or intersection 405. In one embodiment, the second wall member 403 is substantially perpendicular to the first wall member 401, thereby providing a 90° angled portion which conforms to an inside corner of a drawer 105 (FIG. 1), for example. However, the calibration jig 400 is not limited to any particular geometric configuration and may be of any shape and size suitable for engaging a robotic arm 109 (FIG. 1) for the purpose of establishing a home position therefore. In fact, the calibration jig 400 need not even make contact with the drawer 105 or a parts tray 200 (FIG. 3) contained within the drawer 105. As long as the calibration jig 400 may be positioned and secured at a fixed location with respect to the drawer 105 and/or the parts tray 200, the calibration jig 400 will be able to provide a home position for the robotic arm 109, in accordance with the invention.

Extending upwardly from each of the wall members 401 and 403 is a tapered portion 407 having a pointed pinnacle 409. As is explained in further detail below, magnet portions 411 may be integrated into the wall members 401 and 403 for the purpose of holding the calibration jig 400 against a metal wall of a drawer 105 (FIG. 1) which contains one or more parts trays. The calibration jig 400 may be made of any material which is rigid and not susceptible to bending or deforming. In one embodiment, it is made from molded aluminum.

Figure 6:
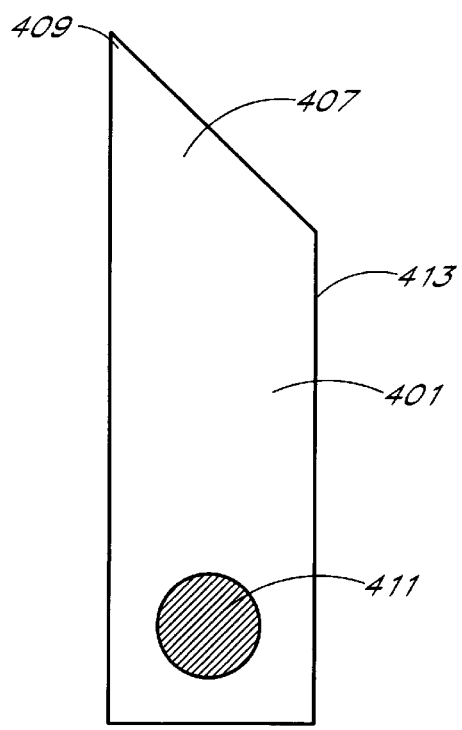
FIG. 6 is a side elevational view of the calibration jig of FIG. 5.

FIG. 6 is a side elevational view of the calibration jig 400 of FIG. 5. As illustrated in FIG. 6, the tapered portion 407 extends upwardly at a sloped angle from an outer edge 413 of the first wall member 401 until it reaches the pinnacle 409. The magnet portion 411 is embedded in the first wall member 401 at a lower portion of the first wall member 401 such that it is flush with the outer surface of the first wall member 401. It is important that the magnet portion 411 does not extrude outwardly from the surface of the first wall member 401 so that the first wall member 401 may make flush contact with a side wall of a drawer, as is described in further detail below. It is appreciated that the second wall member 403 of the calibration jig 400 illustrated in FIG. 5 is symmetrically identical to the first wall member 401 as shown in FIG. 6.

Figure 7:
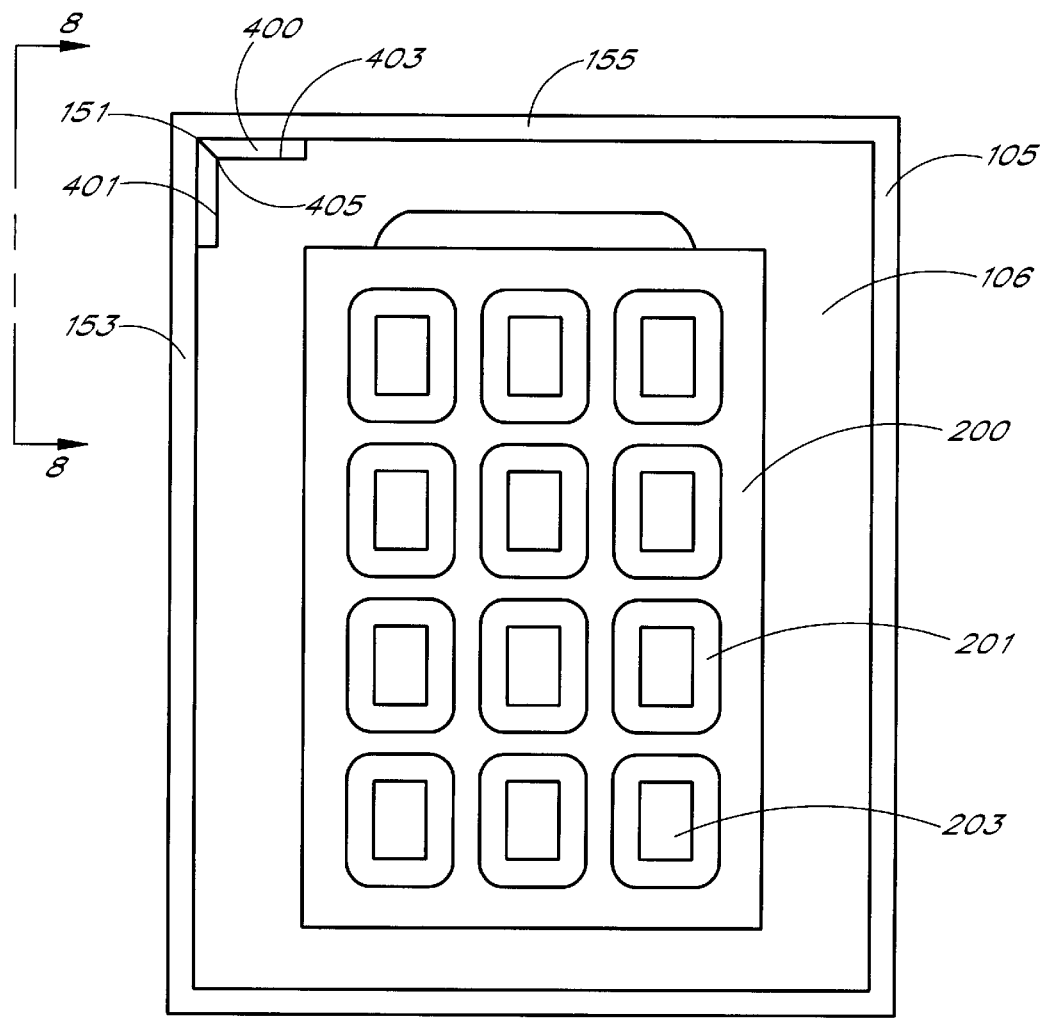
FIG. 7 is a top view of a drawer of a multi-tray unit illustrating a top view of the calibration jig of FIG. 5 positioned at a corner thereof.

Referring to FIG. 7, in one embodiment of the invention, during a calibration process, the calibration jig 400 is placed at an inside corner 151 of a drawer 105 such that the intersection 405 of the calibration jig 400 is aligned with the intersection of two side walls 153 and 155 of the drawer 105 which forms the corner 151. The first wall member 401 of the calibration jig 400 contacts the first side wall 153 of the drawer 105 such that it is flush with the inside surface of the first side wall 153. The second wall member 403 of the calibration jig 400 contacts the second side wall 155 of the drawer 105 such that it is flush with the inside surface of the second side wall 155. The magnet portion 411 (not shown) is integrated into at least one of the wall members 401 and 403 of the calibration jig 400 for the purpose of holding the calibration jig 400 in a relatively fixed position at the corner 151 of the drawer 105. Of course, in order for the magnet portion 411 to accomplish its purpose the side walls 153 and 155 of the drawer 105 must be made from a suitable magnetically susceptible material such as a metal.

Also shown in FIG. 7 is a parts tray 200 contained within the cavity 106 of the drawer 105. The parts tray 200 includes multiple cavities 201 each containing a component 203. After a robotic arm (not shown) has been calibrated by the calibration jig 400, the robotic arm will then move to coordinate positions which have been calculated and entered into a database as described above with reference to FIG. 4, which correspond to respective pick-up points for each component 203. The process of calibrating the robotic arm with the calibration jig 400 is discussed below.

Figure 8:
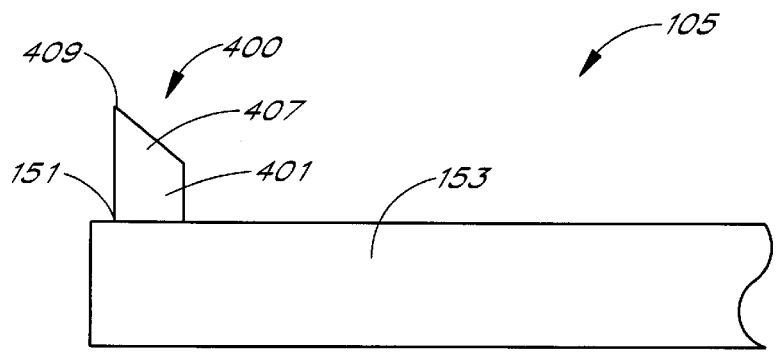
FIG. 8 is a side elevational view, taken along line 8—8 of FIG. 7, which illustrates the calibration jig of FIG. 5 positioned at the corner of the drawer.
Figure 9A:
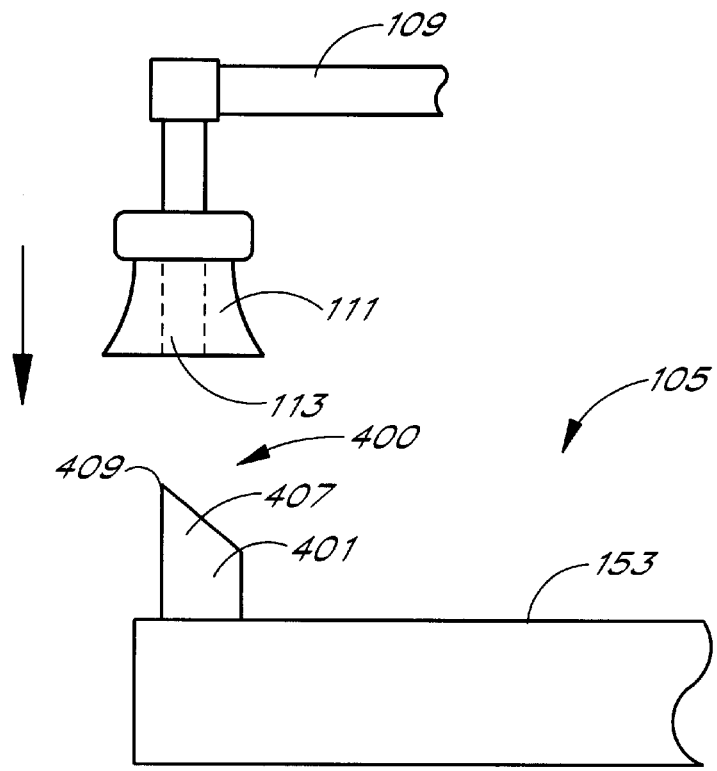
FIG. 9A is a side elevational view of a vacuum nozzle, attached to a robotic arm, illustrating the vacuum nozzle positioned above the calibration jig of FIG. 5.

FIG. 8 shows an elevational side view taken along lines 8—8 of FIG. 7. The calibration jig 400 is positioned at an inside corner 151 of the drawer 105. The first wall member 401 of the calibration jig 400 is flush against the inside surface of the first side wall 153 of the drawer 105. As shown in FIG. 8, the tapered portion 407 of the calibration jig 400 extends upwardly beyond the first side wall 153 and tapers into the pinnacle 409. FIG. 9A illustrates one embodiment of a method of calibrating the home, or origin, position of a robotic arm 109 having a vacuum nozzle 111 and a suction hole 113 within the vacuum nozzle 111. A first step of the calibration process is to manually position the robotic arm 109 such that the suction hole 113 of the vacuum nozzle 109 is roughly aligned with the pinnacle 409 of the calibration jig 400. Typical automated placement machines have robotic arms which may be moved manually while the placement machine continues to track the coordinate position of the robotic arm. In other words, if a system operator manually moves the robotic arm 109 five inches in the positive x-direction, a tracking system within the automated placement machine will indicate that the robotic arm 109 is now at a position which is five inches in the positive x-direction from its previous position.

Figure 9B:
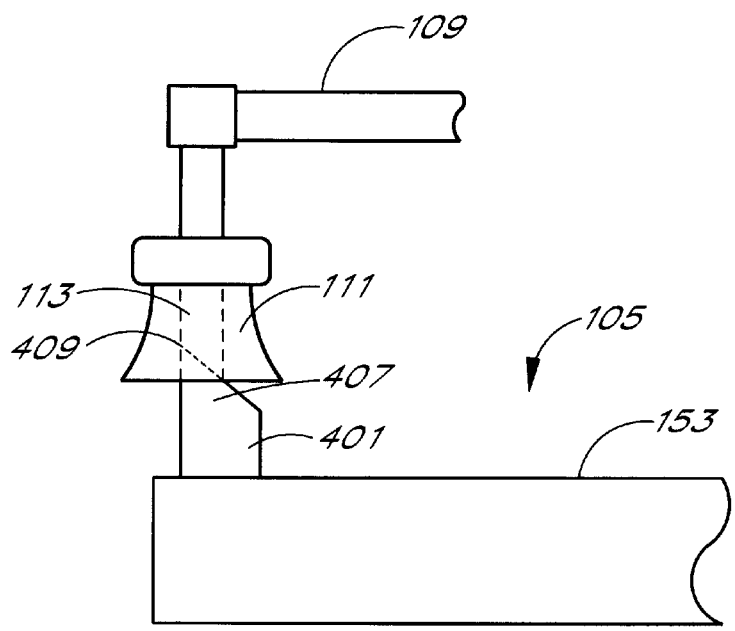
FIG. 9B is a side elevational view of the vacuum nozzle of FIG. 9A illustrating it as being fully engaged with the calibration jig of FIG. 5.

After the robotic arm 109 has been positioned such that the suction hole 113 is roughly aligned with the pinnacle 409 of the calibration jig 400, the robotic arm 109 is moved downwardly so as to enable the vacuum nozzle 111 to engage the calibration jig 400 such that the pinnacle 409 of the calibration jig 400 enters the suction hole 113. Once the vacuum nozzle 11 has fully engaged the calibration jig 400 such that the robotic arm 109 cannot be moved further down, the home position of the robotic arm is established. FIG. 9B is a side elevational view which illustrates the vacuum nozzle 111 in a fully engaged position with respect to the calibration jig 400. At this point, the position of the robotic arm 109 may be set, or stored, as the home position from which all subsequent motion of the robotic arm 109 may be gauged.

In order to set and store the calibration point, the automated placement machine uses motor pulses that are fed back to a computer of the placement machine from a servo amplifier of the placement machine that controls the motor that drives the robotic arm 109. By counting the motor pulses, a main function program stored and executed in the computer of the placement machine can track the position of the robotic arm 109. Each movement of the robotic arm 109 in either an x, y or z direction corresponds to a number of pulses in the x, y or z direction. Typically, the main function program displays a first number corresponding to the x-position, a second number corresponding to the y-position and a third number corresponding to the z-position of the robotic arm 109. These numbers are displayed on a monitor screen coupled to the computer of the placement machine. The computer stores and executes the main function program.

After the robotic arm 109 has been positioned at a home position using the calibration jig 400, as described above, the x, y and z coordinates of the robotic arm 109 may be entered into the main function program. The main function program then stores these coordinates and sets the home position, or origin, of the robotic arm 109 to these coordinates. In one embodiment, the automated placement machine is a Fuji IP machine manufactured by Fuji, Inc. and the main function program is the "Machine Proper" program, also manufactured by Fuji, Inc. These types of automated placement machines and their corresponding main function programs are well-known in the art.

Figure 4:
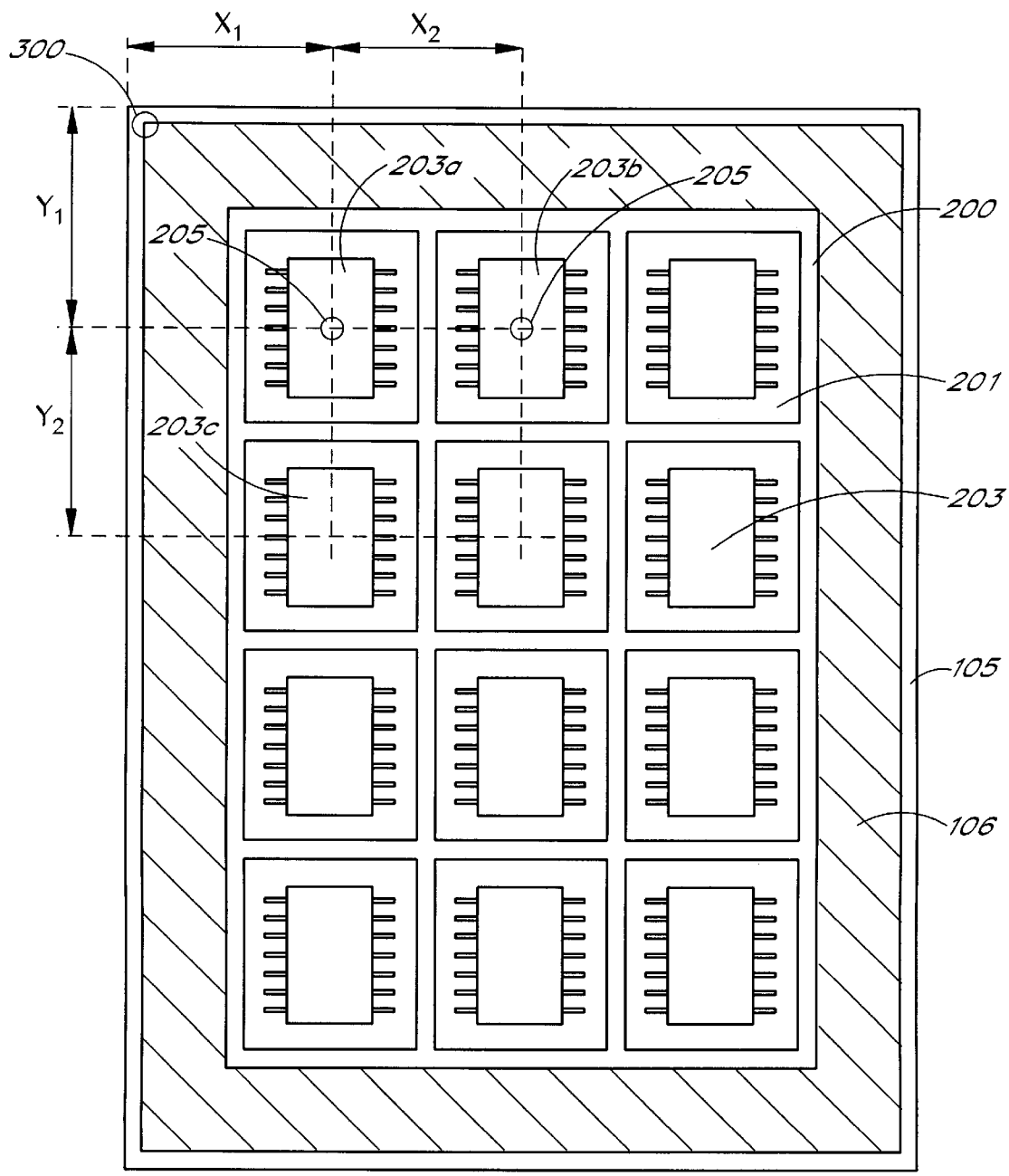
FIG. 4 is a top plan view of the parts tray of FIG. 3.

As can be seen in FIG. 9B, the home position, or origin point, established for the robotic arm 109 substantially corresponds to the pinnacle 409 of the calibration jig 400. The pinnacle 409, in turn, substantially corresponds to the reference point 300 (FIG. 4) of the drawer 105 (FIG. 4). Therefore, it will be appreciated that the origin point of the robotic arm 109 substantially corresponds to the reference point 300 of FIG. 4. Referring again to FIG. 4, if the origin point of the robotic arm corresponds to the reference point 300, by automatically moving the robotic arm from its origin point, a distance X1 in the x-direction and a distance Y1 in the y-direction, the vacuum nozzle will be in substantial alignment with the pick-up point 205 on the body of the first component 203a.

Figure 1:
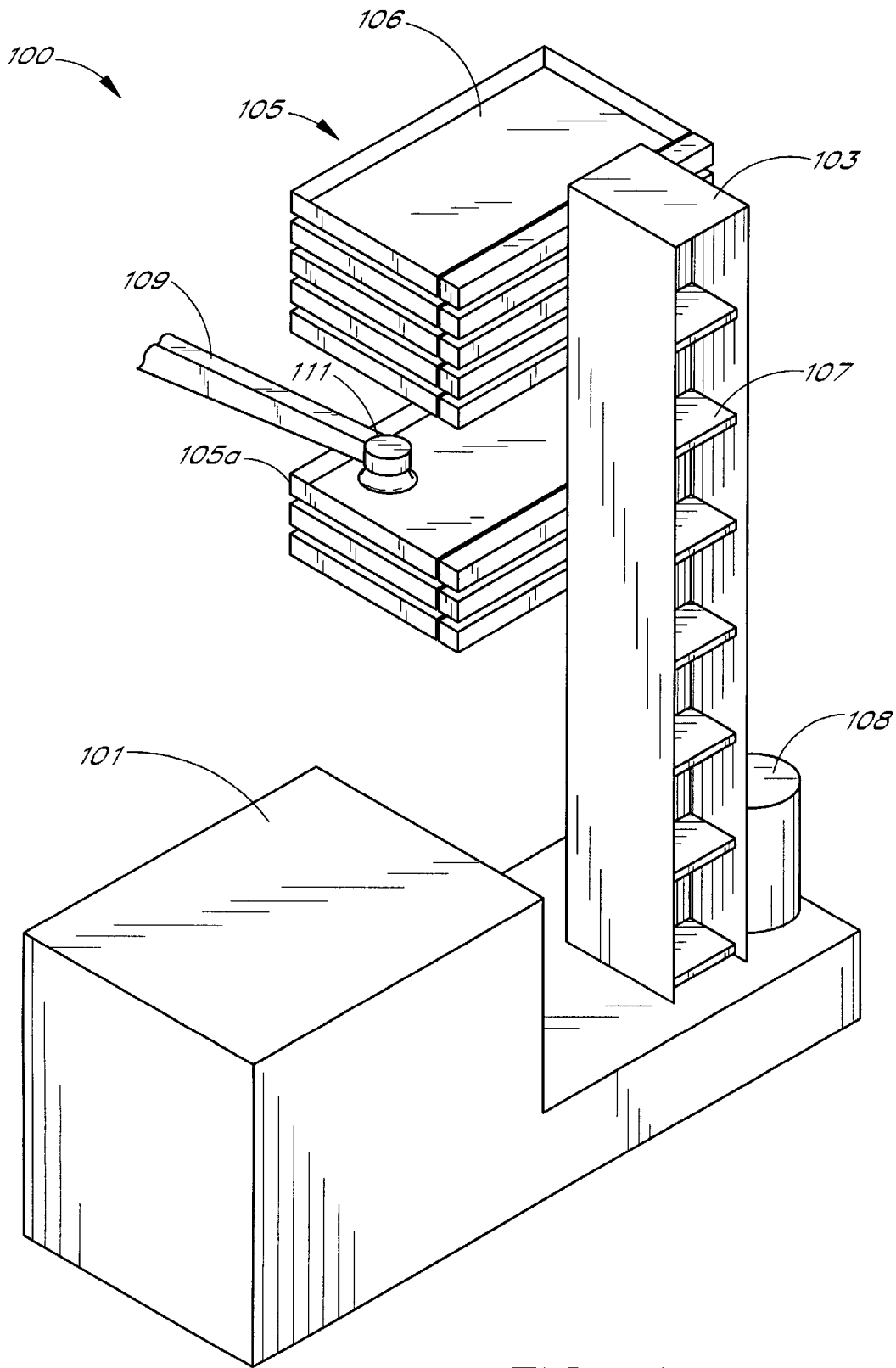
FIG. 1 is a perspective view of a typical multi-tray unit, having multiple drawers for receiving and holding parts trays therein, and a robotic arm having a vacuum nozzle for retrieving components from a parts tray.
Figure 2:
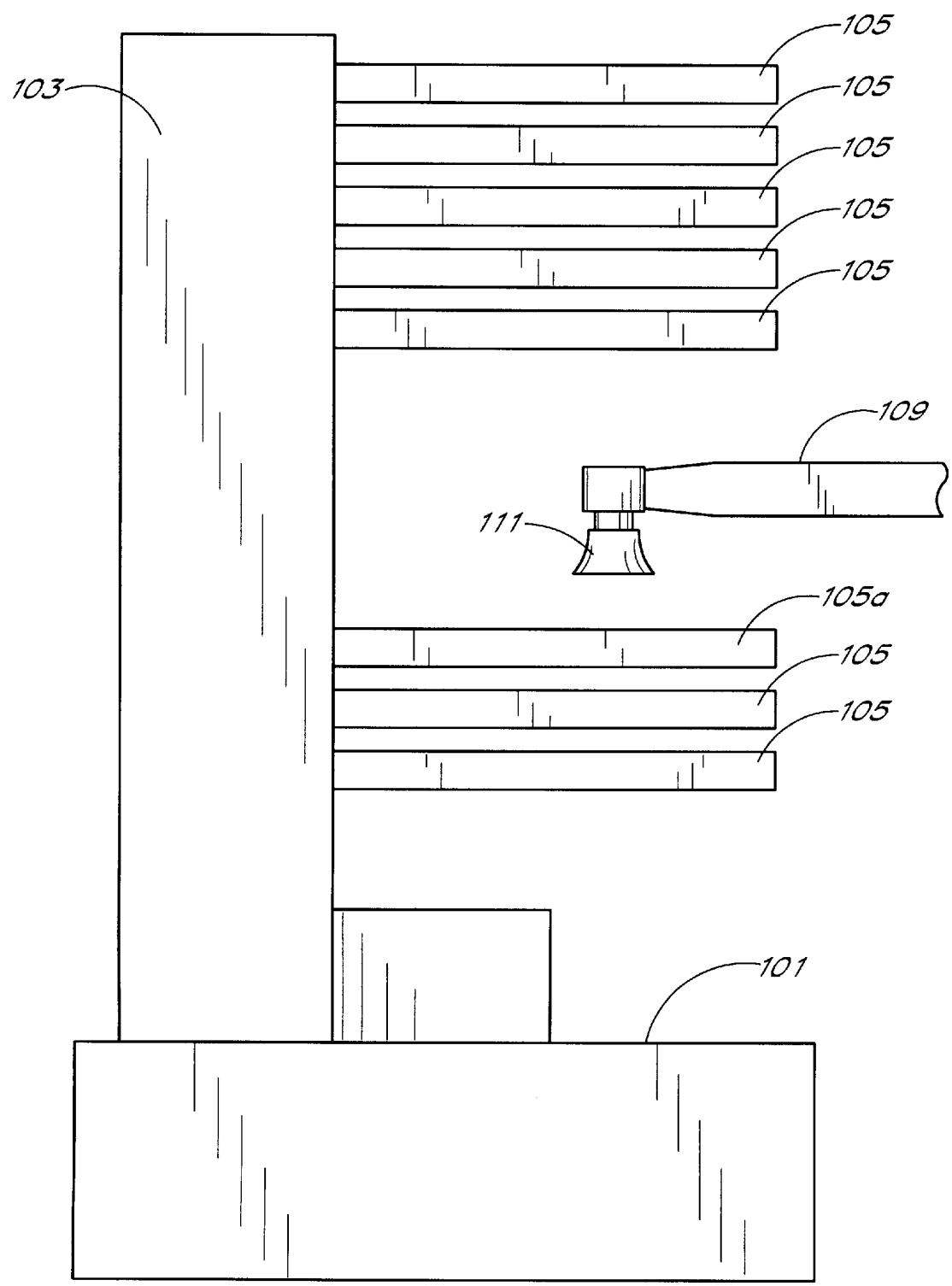
FIG. 2 is a side elevational view of the multi-tray unit and the robotic arm of FIG. 1.

As mentioned above, the calibration jig 400 is not limited to any particular size or shape and may be configured so as to be positioned at locations other than a corner of a drawer 105 (FIG. 1). For example, the calibration jig 400 may be of cylindrical shape and have a first pin, or dowel, attached at one end of its cylindrical body and a second pin, or dowel, attached at the other end of its cylindrical body. The first pin, or dowel, may be inserted into a hole located on a drawer 105 or at a fixed location relative to the drawer 105, thereby functioning as a securing member which secures the calibration jig 400 in a fixed location with respect to the drawer 105. The second pin may serve as an engagement portion of the calibration jig 400 for engaging a specified portion of the robotic arm 109, such as a suction hole of a vacuum nozzle, for example, in order to establish a home position for the robotic arm 109.

As described above, the invention provides a quick, easy and accurate method and apparatus for calibrating the home position of a robotic arm of an automated placement machine. Additionally, the invention provides a calibration method which is easily repeatable and uniform in results. The invention thus provides an accurate and uniform method and apparatus of calibrating the robotic arm of an automated placement machine such that subsequent motion of the robotic arm will substantially correlate with calculated spatial coordinates corresponding to desired pick-up points on respective components within a parts tray.

The invention may be embodied in other specific forms without departing from its spirit or essential characteristics. The described embodiments are to be considered in all respects only as illustrative and not restrictive. The scope of the invention is, therefore, indicated by the appended claims, rather than by the foregoing description. All changes which come within the meaning and range of equivalency of the claims are to be embraced within their scope.

What is claimed:

1. A method of establishing an origin point for an automatic placement machine having a robotic arm which retrieves parts from a container which is a parts tray held within a drawer, comprising:

positioning a calibration jig at a predetermined location with respect to the container including placing the calibration jig within the drawer such that it is juxta-positioned at a corner of the drawer; and engaging a portion of the robotic arm with the calibration jig so as to establish the origin point for the robotic arm, wherein the origin point serves as a reference point from which subsequent movements of the robotic arm are measured.

2. The method of claim 1 wherein said act of engaging the robotic arm with the calibration jig includes inserting a first portion of the calibration jig into a suction hole of a vacuum nozzle attached to the robotic arm, thereby positioning the robotic arm such that the suction hole is substantially vertically aligned above the first portion of the calibration jig.

3. The method of claim 1 further comprising securing the calibration jig in a fixed position at a predetermined location with respect to the container.

4. The method of claim 3 wherein said act of securing includes magnetically attaching the calibration jig against at least one surface of the container.

5. A method of establishing an origin point for an automatic placement machine having a robotic arm for retrieving parts from a container, comprising:

positioning a calibration jig so that it is located at a predetermined location with respect to the container including positioning a vacuum nozzle of said robotic arm above the calibration jig such that a portion of the calibration jig is inserted into a suction hole of the vacuum nozzle;

positioning the robotic arm of the placement machine such that a portion of the robotic arm engages a portion of the calibration jig;

determining a first set of spatial coordinates of the robotic arm when it is engaged with the calibration jig; and setting an origin point of the placement machine such that the first set of spatial coordinates serves as the origin point from which subsequent movements of the robotic arm may be measured.

6. The method of claim 5 further comprising securing the calibration jig in a relatively fixed position with respect to the container.

7. The method of claim 6 wherein the act of securing comprises magnetically attaching the calibration jig in the fixed position with respect to the container.

8. A method of calibrating a home position for a robotic arm of an automated placement machine which retrieves components from a parts tray having cavities for containing components therein, the method comprising:

positioning a calibration jig at a specified distance from a first component within a cavity of the parts tray including placing the calibration jig such that it is juxtapositioned at a corner of a drawer which contains said parts tray;

positioning the robotic arm of the automated placement machine such that a portion of the robotic arm engages a portion of the calibration jig including positioning a vacuum nozzle, attached to the robotic arms above the calibration jig such that a pinnacle portion of the calibration jig is inserted into a suction hole of the vacuum nozzle;

determining a first set of spatial coordinates of the robotic arm when it is engaged with the calibration jig; and setting the home position of the robotic arm such that the first set of spatial coordinates serves as the home position from which subsequent movements of the robotic arm may be measured.

9. A method of automatically retrieving components from a parts tray with a robotic arm of an automated placement machine, comprising:

determining a first set of x-y spatial coordinates corresponding to a location of a first component contained within a first cavity of the parts tray, wherein the first set of x-y spatial coordinates is determined with respect to a reference point;

entering the first set of x-y spatial coordinates into a memory within an automated placement machine;

positioning a calibration jig at the reference point such that a portion of the calibration jig is substantially aligned with the reference point;

positioning the robotic arm of the automated placement machine such that a portion of the robotic arm engages the portion of the calibration jig;

setting a home position of the robotic arm as the position of the robotic are when it is engaged with the calibration jig;

moving the robotic arm from its home position to a location corresponding to the first set of x-y spatial coordinates so as to retrieve the first component;

determining a second set of x-y spatial coordinates corresponding to a location of a second component contained within a second cavity of the pars tray with respect to the reference point;

entering the second set of x-y spatial coordinates into the memory of the automated placement machine; and moving the robotic arm to a location corresponding to the second set of x-y spatial coordinates so as to retrieve the second component, wherein the movement of the robotic arm is measured with resect to the reference point.

10. The method of claim 9 wherein:

said act of positioning said calibration jig comprises placing the calibration jig such that it is juxtapositioned at a corner of a drawer which contains said parts tray; and said act of positioning the robotic arm of the placement machine comprises positioning a vacuum nozzle, attached to the robotic arm, above the calibration jig such that a pinnacle portion of the calibration jig is inserted into a suction hole of the vacuum nozzle.

* * * * *